United States Patent [19]

Love et al.

[11] 4,175,030
[45] * Nov. 20, 1979

[54] TWO-SIDED PLANAR MAGNETRON SPUTTERING APPARATUS

[75] Inventors: Robert B. Love; Alan W. Bowen, both of Franklin, Tenn.

[73] Assignee: Battelle Development Corporation, Columbus, Ohio

[*] Notice: The portion of the term of this patent subsequent to Sep. 26, 1995, has been disclaimed.

[21] Appl. No.: 944,704

[22] Filed: Sep. 22, 1978

Related U.S. Application Data

[63] Continuation-in-part of Ser. No. 858,656, Dec. 8, 1977, Pat. No. 4,116,806.

[51] Int. Cl.$^2$ ............................................. C23C 15/00
[52] U.S. Cl. .................................................. 204/298
[58] Field of Search ............................. 204/192 R, 298

[56] References Cited

U.S. PATENT DOCUMENTS

| | | | |
|---|---|---|---|
| 3,852,181 | 12/1974 | Cirkler et al. | 204/298 |
| 3,856,654 | 12/1974 | George | 204/298 |
| 3,878,085 | 4/1975 | Corbani | 204/298 |
| 3,890,217 | 6/1975 | Burrows et al. | 204/298 |
| 3,945,911 | 5/1976 | McKelvey | 204/298 |
| 3,956,093 | 5/1976 | McLeod | 204/192 |
| 4,013,532 | 3/1977 | Cormia et al. | 204/192 C |
| 4,022,947 | 5/1977 | Grubb et al. | 428/432 |
| 4,060,470 | 11/1977 | Clarke | 204/192 R |

*Primary Examiner*—Aaron Weisstuch
*Attorney, Agent, or Firm*—Philip M. Dunson

[57] ABSTRACT

Apparatus for depositing layers of materials onto substrates by magnetically enhanced cathodic sputtering; typically comprising an enclosure having atmospheric sealing means between the atmosphere inside and the atmosphere outside the enclosure, vacuum pump means connected to the enclosure to reduce the pressure inside relative to the atmospheric pressure outside the enclosure, a cathode within the enclosure comprising a substantially planar frame formed about a parallel interior plane, a plurality of magnets supported within the frame and positioned with the neutral axis of each magnet substantially in the interior plane, and at least one target plate supported on the frame on opposite sides of the interior plane, insulation means between the frame and the enclosure, means for connecting an electrical potential difference between the frame and the enclosure, and means in and supported by the enclosure for supporting and conveying the substrates on opposite sides of, and parallel to, the target plates from a position on one side edge to a position on the opposite side edge of the cathode.

17 Claims, 11 Drawing Figures

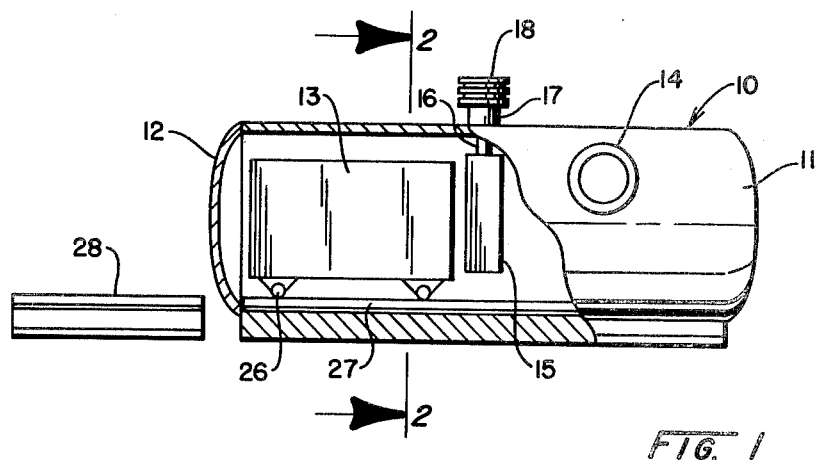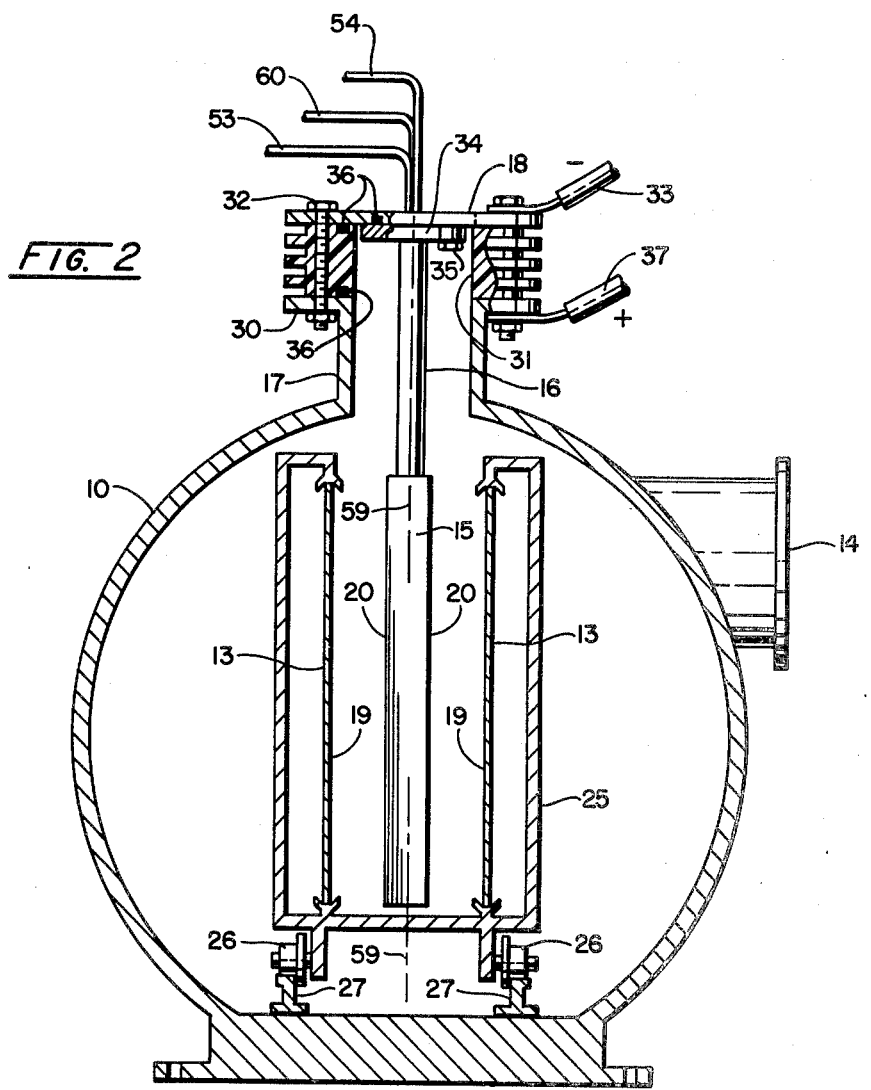

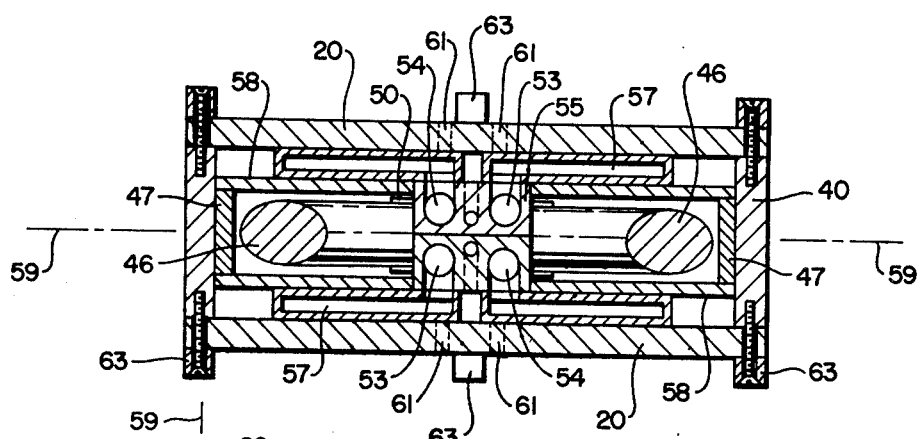
FIG. 4
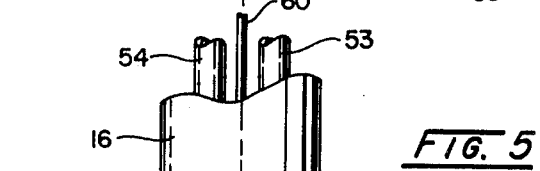
FIG. 5
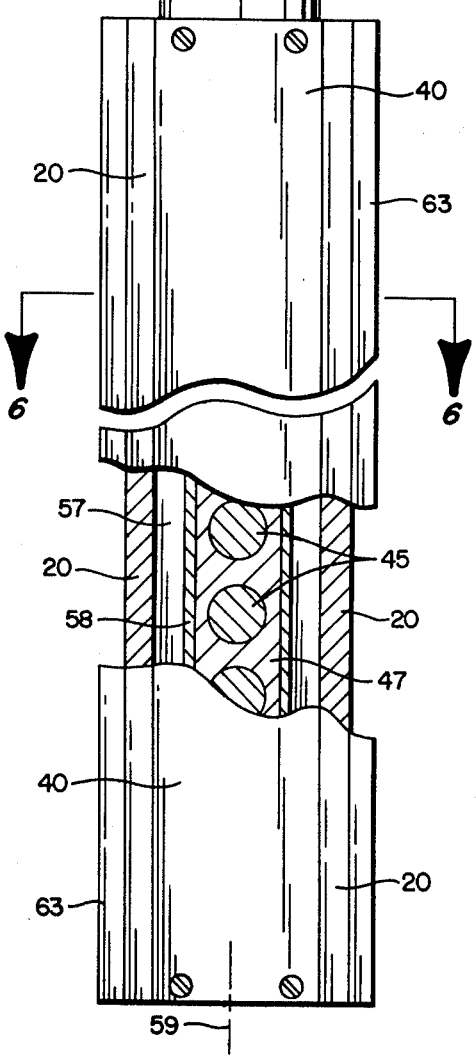
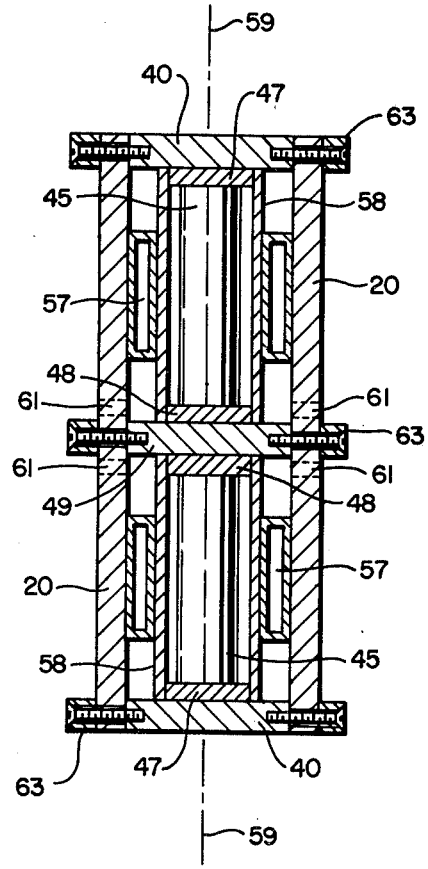
FIG. 6

TWO-SIDED PLANAR MAGNETRON SPUTTERING APPARATUS

This is a continuation in part of our application Ser. No. 858,656, filed Dec. 8, 1977, now U.S. Pat. No. 4,116,806, issued Sept. 26, 1978.

BACKGROUND

This invention relates generally to sputtering apparatus using a magnetic field and generally known as planar magnetron apparatus. Magnetron cathodic sputtering is widely known and extensively used for the coating of thin material onto substrates. The process involves the transport of a material from a cathode to a substrate via the vapor phase. The ejection of the material into the vapor phase is accomplished by bombarding the cathode target with ions of sufficient energy to cause atoms or molecules of the target material to be ejected from the target surface. The process is carried out in a chamber that has been substantially evacuated of air and normally contains a small amount of inert gas. The ejected particles traverse the low pressure gaseous space and condense onto the substrate, forming a thin film coating on the surface thereof.

The process of sputtering with magnetron apparatus is relatively well known and is described in U.S. Pat. Nos. 3,878,085, Corbani; 4,025,410, Stewart; 3,956,093, McLeod; and 4,013,532, Cormia et al.

Objectives constantly sought in the development of cathode magnetron sputtering apparatus and processes are increases in the rate of sputtering, i.e. more rapid thin film coating, and evenness in film thickness, i.e. uniformity of coating.

In addition, the application of films to larger substrate areas is a constantly sought after objective. Economical means of coating large areas such as panes of plate glass for large windows has been a subject of interest and need.

The present invention is directed to these objectives by providing apparatus that is capable of being constructed in relatively large configurations and by providing uniformly sputtered film coatings in large planar substrates with especially efficient use of the magnetic field produced by the magnets.

Controlling stray electrons and controlling the erosion pattern in planar magnetron cathode sputtering apparatus is constantly sought after in the construction of these devices. When stray electrons are allowed to pass beyond the area of the substrate and tangentially leave the zone of maximum sputtering intensity, uneven erosion of the target takes place. In addition some sputtering occurs on other portions of the apparatus itself rather than on the substrate, which is also undesirable.

The present invention provides apparatus for better controlling the sputtering zone and for promoting more even erosion of the target area. The apparatus includes a planar magnetron cathode and associated components for sputtering onto two different surfaces simultaneously.

SUMMARY

A typical two-sided planar magnetron cathode according to the present invention comprises a substantially planar frame formed about a parallel interior plane, a plurality of magnets supported within the frame and positioned with the neutral axis of each magnet substantially in the interior plane, and at least one target plate supported on the frame on opposite sides of the interior plane. The target plates supported on the frame typically are substantially planar and substantially parallel to the interior plane on opposite sides thereof. Typically the frame is generally rectangular in shape and comprises interconnected side members, a bottom member, and a top member, with the top member connected removably to a tubular support member. Magnetic pole pieces may be supported on the external surfaces of the target plates in a position parallel to the interior plane.

The frame preferably contains and supports means for cooling the magnets within it. The cooling means typically comprises an inlet conduit for a cooling fluid and an outlet conduit supported through the frame, whereby the cooling fluid may enter the inlet conduit, circulate through the space within the frame, and exit through the outlet conduit to cool the planar cathode.

In typical apparatus according to the present invention for depositing layers of materials onto substrates by magnetically enhanced cathodic sputtering, a two-sided planar magnetron cathode comprises a frame of substantially rectangular shape formed about a parallel interior plane, the frame comprising longer side members and shorter end members, a plurality of magnets supported within the frame and positioned with the neutral axis of each magnet substantially perpendicular to the longer side frame members and being substantially in the interior plane, at least one target plate supported on the frame on opposite sides of the interior plane, means for connecting an electrical potential to the frame, and means for cooling the frame. Typically the frame contains and supports means for cooling the magnets within it.

The apparatus for depositing layers of materials onto substrates by magnetically enhanced cathodic sputtering typically comprises an enclosure having atmospheric sealing means between the atmosphere inside and the atmosphere outside the enclosure, vacuum pump means connected to the enclosure to reduce the pressure inside relative to the atmospheric pressure outside the enclosure, a cathode within the enclosure comprising a substantially planar frame formed about a parallel interior plane, a plurality of magnets supported within the frame positioned with the neutral axis of each magnet substantially in the interior plane, and at least one target plate supported on the frame on opposite sides of the centerplane, insulation means between the frame and the enclosure, means for connecting an electrical potential difference between the frame and the enclosure, and means in and supported by the enclosure for supporting and conveying the substrates on opposite sides of, and parallel to, the target plates from a position on one side edge to a position on the opposite side edge of the cathode. Typically, means is provided to introduce an ionizing gas into the enclosure. Preferably the ionizing gas is conveyed into the space between the target plates and holes are provided in the target plates for the gas to pass through to sweep across the outer faces of the target plates. Typically, means is provided to cool the cathode.

In some embodiments of the apparatus anode means is provided substantially parallel to the cathode, and electrically connected to the enclosure. The size of the anode means may be adjustable. Typical anode means comprises conforming shaped electrical conductors positioned on opposite sides of the interior plane. The anode may comprise a conduit formed for the introduction, circulation, and withdrawal of a cooling fluid.

In typical apparatus according to the invention for depositing layers of materials onto substrates by magnetically enhanced cathodic sputtering including sealable enclosure means containing a planar magnetron cathode and means for conveying substrates in proximity to the cathode under sputtering conditions, a cathode apparatus comprises a substantially planar frame formed about a parallel interior plane, a plurality of magnets supported within the frame and positioned with the neutral axis of each magnet substantially in the interior plane, and at least one target plate supported on the frame on opposite sides of the interior plane and positioned in a plane parallel to the path of conveyance of the substrates.

DRAWINGS

FIG. 1 is a largely schematic vertical longitudinal cross sectional view of typical sputtering apparatus in which the present invention is useful.

FIG. 2 is a sectional schematic view, taken in the plane 2—2, of the apparatus shown in FIG. 1.

FIG. 4 is a sectional plan view, taken in the plane 4—4, of the cathode shown in FIG. 3.

FIG. 5 is an elevational side view of the cathode shown in FIGS. 3 and 4.

FIG. 6 is a sectional plan view, taken in the plane 6—6 of FIG. 5, of the cathode shown in FIGS. 2-5.

DETAILED DESCRIPTION

Figure 3:
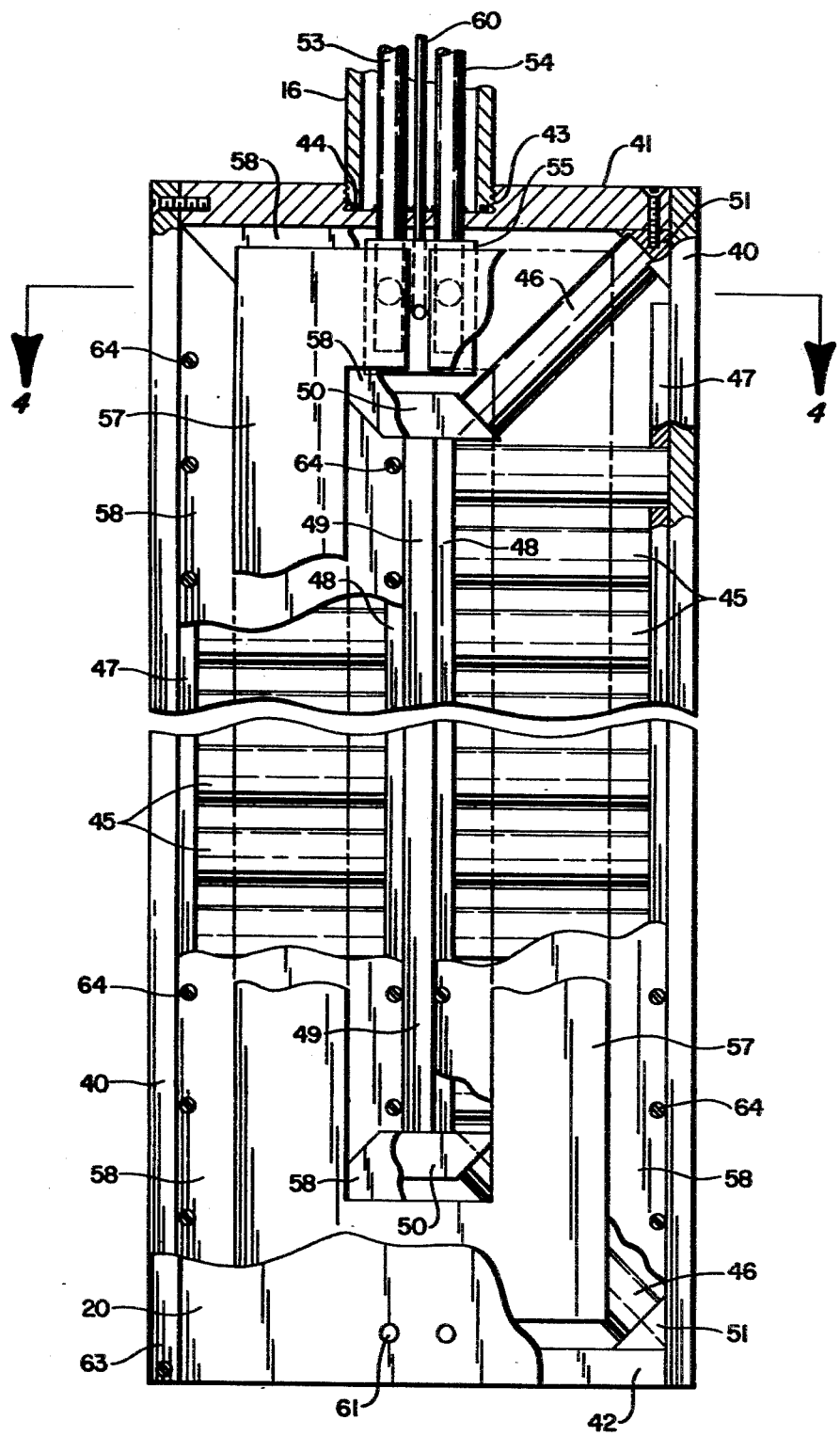
FIG. 3 is an elevational front view of a typical planar magnetron cathode according to this invention with portions broken away to reveal the internal structure of the apparatus.

Typical apparatus in which the present invention is useful is shown in FIGS. 1 and 2. In these figures an enclosure 10 is provided in which the sputtering process is conducted in a rarified gaseous atmosphere. The enclosure 10 is of well known vacuum chamber construction with sealed ends 11 and 12. The end 12 is adapted to be readily opened for the insertion and removal of work piece substrates 13 into and away from the enclosure 10. The enclosure 10 is connected through a conduit 14 to a vacuum pump, not shown, by which the pressure of the atmosphere in the enclosure 10 is reduced to a suitable low level for the sputtering process to take place.

A planar magnetron cathode 15 is centrally suspended in the enclosure 10 by a supporting tubular member 16 from a vertically upward extending cylindrical housing structure 17 having an upper cap plate 18.

In the normal operation of the sputtering apparatus two substrates 13 are coated on their inner surfaces 19 simultaneously from opposite target sides 20 of the planar magnetron cathode 15.

The substrates 13 are carried through the coating operation on a carriage 25, which is supported on wheels 26 that roll on tracks 27. The tracks 27 extend the length of the enclosure 10 and have mating portions 28 external of the enclosure 10.

In normal operation the carriage 25 is loaded with the substrates 13 while in an external position on the track portions 28 with the sealing closure door 12 in open position. After loading, the carriage 25 is rolled to the first position for processing as shown in FIG. 1. The door 12 is closed and the enclosure 11 is pumped down to an appropriate rarified internal atmosphere of about 0.5 to 50 milliTorr. Argon or another inert gas is introduced into the enclosure by means that are described in further detail later. An electrical potential in the range of minus 600 volts is applied to the cathode 15 as the carriage 25 is conveyed longitudinally past the cathode 15 at a uniform rate. During the travel of the substrates 13 past the cathode 15 a film of material from the targets 20 is deposited on the substrate surfaces 19. After the coating operation is completed the carriage 25 is returned to the external portion 28 of the track where the substrates 13 are removed and the carriage 25 is reloaded for the next cycle.

As will be seen most clearly in FIG. 2, the housing 17 is provided with an upper flange 30 on which is circumferentially fitted an insulator member 31. The insulator member 31 is made of an electrically insulating material, such as glass, ceramic, polytetrafluoroethylene, or other well known similar material. The cap plate 18 is circumferentially fitted to the top of the insulator 31. The members 30, 31, and 18 are held together with threaded fasteners 32 made of insulating material.

An electrical connection 33 is provided from a source of electrical potential (not shown). The electrical potential applied at the connection 33 is conventionally designated as negative or minus. Another electrical connection 37 is provided to the enclosure 10 which is conventionally designated as positive or ground.

By means of a flange 34 and fasteners 35, the support member 16 is attached to the cap 18. Suitable seals such as O rings 36 are provided between the various members 30, 31, 18, and 34.

The planar magnetron cathode 15, as most clearly shown in FIG. 3, is generally rectangular in shape, having side members 40 connected to upper and lower lateral frame members 41 and 42 respectively, by screws or other suitable fastening means. The upper lateral support 41 is connected to the tubular support 16 by threaded fitting means 43 with a seal such as an O ring 44.

Where it is intended for uniform and balanced deposition of coatings, the magnetron cathode 15 is made generally symmetrical about all center lines both vertical and horizontal. Laterally placed permanent magnets 45 and corner magnets 46 are positioned with their neutral axes on the plane of the vertical lateral center line of the magnetron cathode 15. The outer and inner ends of the horizontal magnets 45 are gripped by retainer pieces 47 and 48 respectively. The outer retainer pieces 47 are suitably fastened to the frame members 40 with screws or other fastening means. The inner retainers 48 are fastened in like manner to a central frame member 49, which is connected at each end to a corner magnet retainer block 50. The blocks 50 receive the central ends of the corner magnets 46. At its opposite end each corner magnet 46 is retained by a corner block 51, which is connected to the frame members 40, 41, and 42 by suitable fastening means such as screws.

Provided within the planar magnetron cathode 15 is a cooling system comprising inlet conduits 53 and outlet conduits 54, which are connected to rectangular conduits 57, which are in general conformity to the rectangular shape of the magnetron cathode 15. Magnet cooling heat conductor plates 58 are attached to retainers 47 and 48, by screws or other suitable fasteners 64, in contact position to the internal surfaces of the conduits 57. A cooling fluid enters the inlet conduits 53, circulates through the internal conduits 57, and exits through the outlet conduits 54, to cool the cathode 15, including the magnets 45,46.

Alternatively the cooling may be provided without the conduits 57 and conductor plates 58. The surfaces in the interior of the cathode 15 are covered with a corrosion resistant coating, and the frame is sealed to form a fluid-tight enclosure. The cooling fluid enters the inlet conduits 57, circulates through the space within the frame, and exits through the outlet conduits 54, to cool the cathode 15, including the magnets 45,46.

In the normal operation of the apparatus an electrical current is applied through the cathode at a potential of approximately minus 600 volts. This would produce sufficient quantities of heat that the efficiency of the magnets would be reduced, were it not for the cooling system. In the cooling system a cooling fluid such as water is pumped through the inlet conduits 53, the header blocks 55, and the conduits 57, finally exiting through the header blocks 55 and the outlet conduits 54. Heat is collected by the conductor plates 58 and the walls of the conduit 57 from the magnets and the frame members as well as the target plates 20.

An additional conduit tubing 60 is positioned through the upper frame member 41 and is connected through the header 55 to the internal area of the cathode 15, which is open to the internal zone of the enclosure 10 through holes 61 in the target sides 20. In normal sputtering operations an inert gas, such as argon, is admitted to the rarified atmosphere of the enclosure 10 through the conduit 60 and passes out through the holes 61, sweeping across the outer faces of the target plates 20 to provide a distributed flow of gas thereon. The conduits 60, 53, and 54 are solder sealed through the support 41 to keep the inside of the enclosure isolated from the outside atmosphere.

In the construction shown, the support members 40, 41, 42 and 49, as well as the corner blocks 50 and 51, are made from conductive soft magnetic steel. Consequently these members act as pole pieces for the magnets. The retainer pieces 47 and 48 are made of aluminum so as not to interfere with the flux patterns from the magnets.

In the typical embodiment of the planar magnetron cathode 15 shown in the drawings, all of the magnets 45,46 are centrally disposed equidistant from the target plates 20 on either side. With the internal construction of the cathode 15 substantially symmetrical on either side of the magnets 45,46, the fields of magnetic flux on both sides of the cathode 15 are substantially the same. So the cathode 15 as shown is double acting and useful for substantially identical operation on both sides simultaneously.

A cylindrical bar magnet provides a substantially uniform flux pattern that is externally eliptical from one end of the magnet to the other and passes through the central longitudinal axis or neutral axis of the magnet, but previous planar magnetron cathode constructions have not taken advantage of the magnetic flux energy that is available on both opposite sides of the magnet.

In typical apparatus of the present invention, the magnets are placed with their central longitudinal axis or neutral axis in the centerplane 59 of the planar magnetron structure (FIGS. 4–6). Advantage is therefore taken of the substantially equal flux available on opposite sides of the same magnets to provide a balanced double acting magnetron cathode.

The advantages of the double acting planar magnetron cathode are many. In the construction of sputtering apparatus economies are available, since fewer magnets are required for the same output. Less material is needed since the apparatus is more compact. Production from the apparatus is doubled, so the capital investment is lower per unit of coated product, since the cost of magnets and other components per unit of plated surface is reduced.

In some embodiments, extended pole pieces 63 may be advantageously fastened to the surface of the target plates 20. The extended pole pieces 63 are made of soft iron, which alters the shape of the magnetic flux field in the sputtering area adjacent to the target face. The targets 20 sputter more evenly when the external pole pieces 63 are used. However, the external pole pieces are not required.

The external pole pieces 63 are vertically disposed on the longitudinal dimension of the planar magnetron cathode 15 perpendicular to the plane of the substrate 13 that passes adjacent thereto. They are fastened by any suitable means, such as screws. The external pole pieces also can serve to hold the target material on the cathode.

For some purposes the cathode 15 need not be symmetrical in one or more directions. In some cases asymmetric forms of the cathode may even be preferred. An asymmetric double sided magnetron cathode allows the neutral axis of the magnetic field to be varied in position relative to the cathode surfaces. Through this asymmetry, cathode materials of dissimilar thicknesses can be chosen since the magnetic field can now be appropriately varied for efficient sputter operation. Asymmetric shapes may be used also where it is desired to coat a different size, shape, or type of substrate on each side, or for other unbalanced coating operations.

It has been found that certain materials such as stainless steel and other alloys are easily sputtered at rates in the range of 2000 to 10,000 angstroms per minute.

The apparatus shown in FIGS. 1 and 2 is constructed for operation in a mode where the surrounding structure 10 serves as the anode. Magnetically enhanced cathode sputtering is often conducted in this mode. However, coating of thin films by sputtering in other modes is also well known.

Figure 7:
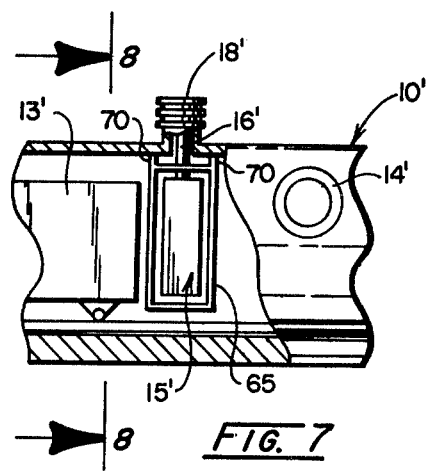
FIG. 7 is a largely schematic vertical longitudinal cross sectional view of another embodiment of typical sputtering apparatus in which the present invention is useful.
Figure 8:
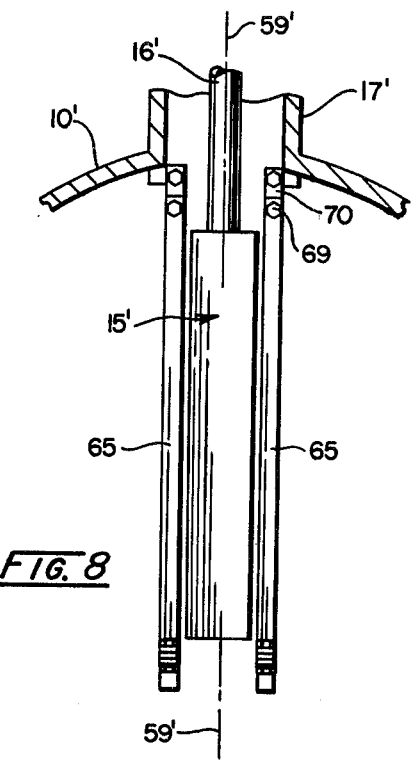
FIG. 8 is a sectional schematic view taken in the plane 8—8, of the apparatus shown in FIG. 7.
Figure 9:
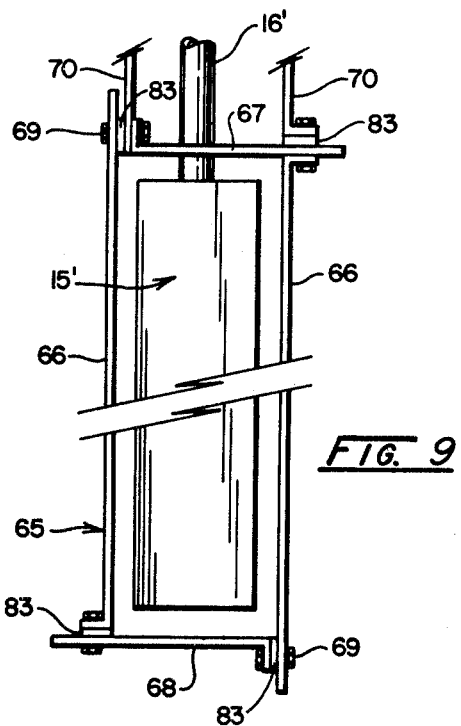
FIG. 9 is an elevational front view of a typical planar magnetron cathode according to this invention, in an embodiment that includes additional anode apparatus that may be used with the invention.

In FIGS. 7, 8, and 9 embodiments of typical apparatus using this invention are shown in which sputtering is conducted either in the grounded-anode or in the floating anode mode. The apparatus, as shown in FIG. 7, includes an anode frame 65, typically, but not necessarily, symmetrically disposed around the cathode 15'. When the anode frame 65 is electrically connected to the chamber 10', operation is in the grounded-anode mode. If the anode frame 65 is connected electrically to the positive terminal of the sputtering power supply and is insulated from the chamber 10', the operation is in the floating-anode mode. The cathode 15' is of the same construction as previously described for the embodiment of FIGS. 1 and 2, and as shown in FIGS. 3, 4, 5, and 6. The anode 65, as most clearly shown in FIGS. 8 and 9, is generally rectangular in shape, having side members 66 connected to upper and lower lateral frame members 67 and 68, respectively, by screws or other suitable fastening means 69.

There is typically a substantially identical anode 65 on each side of the cathode 15'. Typically, but not necessarily, the anodes 65 are symmetrically positioned with respect to the centerplane 59' and all centerlines of the cathode 15'.

Where desired, the size of the anode 65 may be made adjustable, as by providing spacers of selected thicknesses 83, or slots in the frame members 66, 67, 68, or both, for connecting them together by the screws 69 at any of several selected connecting points, to provide an appropriate frame size for the particular pressure and other conditions of a given operation. Also in some embodiments a single anode 65 may be used instead of the two shown in FIG. 8, in which case its centerplane typically, but not necessarily, coincides with the centerplane 59'.

Support is provided to the anode 65 from the enclosure 10' through frame members 70 by any suitable well known means such as brazing, welding, or screws. The anode 65 is made from a good electrical conductor material, such as copper.

Figure 11:
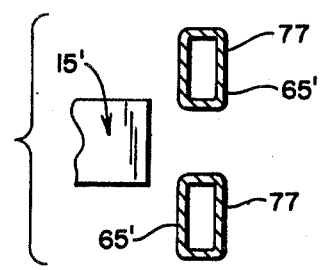
FIG. 11 is a sectional view, taken in the plane 11—11, of the apparatus shown in FIG. 10.
Figure 10:
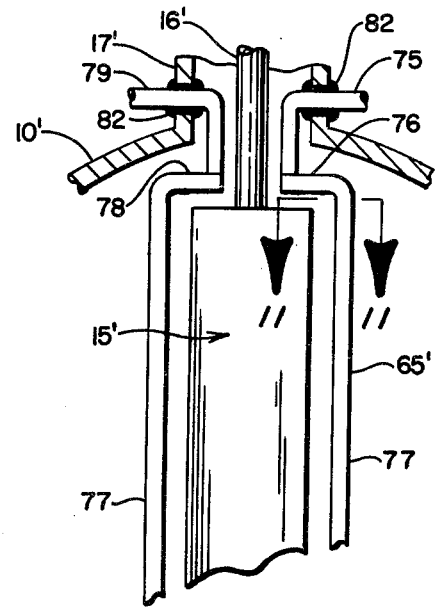
FIG. 10 is an elevational front view of a typical planar magnetron cathode according to this invention in still another embodiment of an anode that may be used with the invention.

Still another embodiment of the anode 65 is shown in FIGS. 10 and 11. In this embodiment, the anode 65' is generally rectangular in shape, substantially conforming to the perimeter and configuration of the cathode 15'. The anode 65' is constructed of hollow tubing having an inlet duct 75, a header portion 76, a conduit portion 77, a header portion 78, and an exit duct 79. A cooling fluid such as water is caused to flow through the inlet duct 75 and the header portion 76, circulating through the conduit portion 77, the header portion 78, and the exit duct 79. Suitable sealing and electrical insulation are provided at 82 between the enclosure 10' and the ducts 75, 79 to keep the inside of the enclosure 10' isolated from the outside atmosphere and to electrically insulate the ducts 75, 79 from the enclosure 10' for operation in the floating-anode mode. The seal at 82 may be made of electrically conductive material where operation is to be in the grounded-anode mode. By means of the cooling conduit construction and the cooling fluid, the anode 65' may be operated at a lower temperature, further enhancing the efficiency of the operation of the sputtering process.

As in the previously described embodiment of FIGS. 8 and 9, typically there is a substantially identical anode 65' on each side of the cathode 15'. The anodes 65' typically, but not necessarily, are symmetrically positioned with respect to and parallel to the centerplane 59', as well as symmetrical with respect to all centerlines of the cathode 15'.

When planar magnetron sputtering operations are carried out with the apparatus of this invention, it has been found that operation in the grounded-anode mode or in the floating-anode mode with anodes 65 or 65' is useful in some conditions. When thin film coating materials such as stainless steel or chromium are used the anodes 65', 65 have been found to be useful.

The anodes 65, 65' have the effect of controlling stray electrons and the glow discharge and minimizing substrate heating when used with the cathode 15, 15' of this invention. Stray electrons are attracted to the anodes 65, 65', which are positioned in closer proximity to the targets 20' and the substrates 13' than are the other frame or support members.

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit or scope of the invention.

We claim:

1. A two-sided planar magnetron cathode comprising a substantially planar frame formed about a substantially parallel interior plane,
a plurality of magnets supported within the frame and positioned with a neutral axis of each magnet substantially in the interior plane, and
at least one target plate supported on the frame on opposite sides of the interior plane.

2. Apparatus as in claim 1, wherein the target plates supported on the frame are substantially planar and substantially parallel to the interior plane on opposite sides thereof.

3. Apparatus as in claim 1, wherein the frame is generally rectangular in shape and comprises interconnected side members, a bottom member, and a top member, with the top member connected removably to a tubular support member; and serves as pole pieces for the magnets.

4. Apparatus as in claim 1, wherein external magnetic pole pieces are supported on the external surfaces of the target plates in a position parallel to the interior plane.

5. Apparatus as in claim 1, wherein the frame contains and supports means for cooling the magnets within it.

6. Apparatus as in claim 5, wherein the cooling means comprises an inlet conduit for a cooling fluid and an outlet conduit supported through the frame, whereby said cooling fluid may enter the inlet conduit, circulate through the space within the frame, and exit through the outlet conduit to cool the planar cathode.

7. In an apparatus for depositing layers of materials onto substrates by magnetically enhanced cathodic sputtering, a two-sided planar magnetron cathode comprising
a substantially planar frame of substantially rectangular shape formed about a substantially parallel interior plane, the frame comprising longer side members and shorter end members,
a plurality of magnets supported within the frame and positioned with the neutral axis of each magnet substantially perpendicular to the longer side frame members and being substantially in the interior plane,
at least one target plate supported on the frame on opposite sides of the interior plane,
means for connecting an electrical potential to the frame, and
means for cooling the frame.

8. Apparatus as in claim 7, wherein the frame contains and supports means for cooling the magnets within it.

9. Apparatus for depositing layers of materials onto substrates by magnetically enhanced cathodic sputtering comprising an enclosure having atmospheric sealing means between the atmosphere inside and the atmosphere outside the enclosure, vacuum pump means connected to the enclosure to reduce the pressure inside relative to the atmospheric pressure outside the enclosure, a cathode within the enclosure comprising a substantially planar frame formed about a substantially parallel interior plane, a plurality of magnets supported within the frame and positioned with the neutral axis of each magnet substantially in the interior plane, and at least one target plate supported on the frame on opposite sides of the interior plane, insulation means between the frame and the enclosure, means for connecting an electrical potential difference between the frame and the enclosure, and means in and supported by the enclosure for supporting and conveying the substrates on opposite sides of, and parallel to, the target plates from a position on one side edge to a position on the opposite side edge of the cathode.

10. Apparatus as in claim 9, wherein means is provided to introduce an ionizing gas into the enclosure.

11. Apparatus as in claim 10, wherein the ionizing gas is conveyed into the space between the target plates and holes are provided in the target plates for the gas to pass through to sweep across the outer faces of the target plates.

12. Apparatus as in claim 9, wherein means is provided to cool the cathode.

13. Apparatus as in claim 9, wherein anode means is provided substantially parallel to the cathode and electrically connected to the enclosure.

14. Apparatus as in claim 13, wherein the size of the anode means is adjustable.

15. Apparatus as in claim 13, wherein the anode means comprises conforming shaped electrical conductors positioned on opposite sides of the interior plane.

16. Apparatus as in claim 15, wherein the anode comprises a conduit formed for the introduction, circulation, and withdrawal of a cooling fluid.

17. In apparatus for depositing layers of materials onto substrates by magnetically enhanced cathodic sputtering including sealable enclosure means containing a planar magnetron cathode and means for conveying substrates in proximity to the cathode under sputtering conditions, a cathode apparatus comprising a substantially planar frame formed about a substantially parallel interior plane, a plurality of magnets supported within the frame and positioned with the neutral axis of each magnet substantially in the interior plane, and at least one target plate supported on the frame on opposite sides of the interior plane and positioned in a plane parallel to the path of conveyance of the substrates.

* * * * *